(12) United States Patent
Jung et al.

(10) Patent No.: US 9,305,990 B2
(45) Date of Patent: Apr. 5, 2016

(54) CHIP-ON-FILM PACKAGE AND DEVICE ASSEMBLY INCLUDING THE SAME

(71) Applicant: SAMSUNG ELECTRONICS CO., LTD., Gyeonggi-do (KR)

(72) Inventors: Jae-Min Jung, Seoul (KR);
Kyong-Soon Cho, Gyeonggi-do (KR);
Jeong-Kyu Ha, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 38 days.

(21) Appl. No.: 14/202,167

(22) Filed: Mar. 10, 2014

(65) Prior Publication Data

US 2014/0300849 A1  Oct. 9, 2014

(30) Foreign Application Priority Data

Apr. 5, 2013 (KR) .................. 10-2013-0037618

(51) Int. Cl.
| G02F 1/1343 | (2006.01) |
| G02F 1/1345 | (2006.01) |
| H01L 27/32 | (2006.01) |
| H01L 23/498 | (2006.01) |

(52) U.S. Cl.
CPC ........ *H01L 27/3276* (2013.01); *H01L 23/4985* (2013.01); *G02F 1/13452* (2013.01); *H01L 2224/16225* (2013.01); *H01L 2924/12044* (2013.01)

(58) Field of Classification Search
CPC .............. H01L 23/5226; H01L 21/486; G02F 1/13452
USPC .................................. 349/149–150, 139, 152
See application file for complete search history.

(56) References Cited

U.S. PATENT DOCUMENTS

| 6,677,664 | B2 | 1/2004 | Inoue et al. |
| 7,349,054 | B2 | 3/2008 | Kohtaka |
| 7,414,851 | B2 | 8/2008 | You |
| 7,453,543 | B2 | 11/2008 | Matsuhira et al. |
| 7,872,877 | B2 | 1/2011 | Urano et al. |
| 8,174,839 | B2 | 5/2012 | Kim et al. |
| 2008/0137166 | A1* | 6/2008 | Sah .............................. 359/245 |
| 2009/0162607 | A1 | 6/2009 | Lee et al. |
| 2009/0303426 | A1* | 12/2009 | Kim .............................. 349/150 |
| 2010/0103126 | A1 | 4/2010 | Nakamura et al. |
| 2010/0141617 | A1* | 6/2010 | Chung et al. .................. 345/205 |

(Continued)

FOREIGN PATENT DOCUMENTS

| JP | 10133816 | 5/1998 |
| JP | 2008209614 | 9/2008 |
| JP | 2009152533 | 7/2009 |

(Continued)

*Primary Examiner* — Nathanael R Briggs
(74) *Attorney, Agent, or Firm* — F. Chau & Associates, LLC

(57) ABSTRACT

Provided are a chip-on-film (COF) package and a device assembly including the same. The device assembly includes a COF package including a film substrate on which a plurality of film-through wires are formed. The device assembly includes a panel unit including a panel substrate on which a plurality of panel-through wires are formed. The panel unit is disposed on the COF package. One end of the panel unit is electrically connected to a first end of the COF package. The device assembly includes a control unit disposed below the panel unit. One end of the control unit is electrically connected to a second end of the COF package.

18 Claims, 15 Drawing Sheets

(56) References Cited

U.S. PATENT DOCUMENTS

2010/0149159 A1   6/2010  Kim
2010/0149775 A1*  6/2010  Park et al. .................... 361/783

FOREIGN PATENT DOCUMENTS

JP    2010199500    9/2010
KR    100441846     9/2004

* cited by examiner

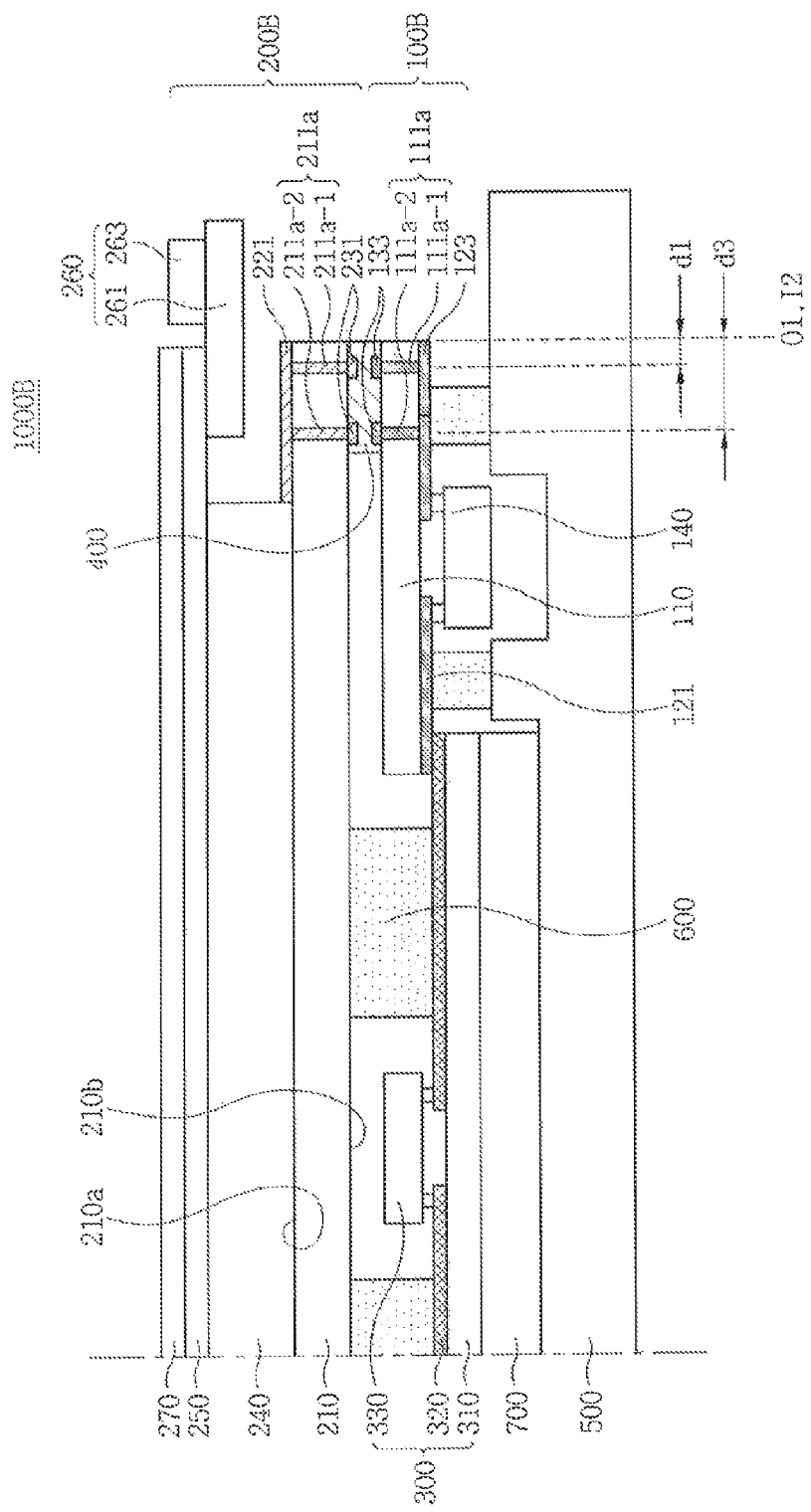

CHIP-ON-FILM PACKAGE AND DEVICE ASSEMBLY INCLUDING THE SAME

CROSS-REFERENCE TO RELATED APPLICATION

This application claims priority under 35 U.S.C. §119 to Korean Patent Application No. 10-2013-0037618 filed on Apr. 5, 2013, the disclosure of which is incorporated by reference herein in its entirety.

TECHNICAL FIELD

The present inventive concept relates to semiconductor package technology, and more particularly, to a chip-on-film (COF) package and a device assembly including the same.

DISCUSSION OF RELATED ART

Electronic products have been developed to become smaller, thinner, and lighter. Various chip-on-film (COF) package technologies using a flexible film substrate have been suggested as high-density chip mounting technologies.

SUMMARY

Exemplary embodiments of the present inventive concept provide a chip-on-film (COF) package having a 2-layer structure and a vertical structure using through-hole wires, and a device assembly including the same.

In accordance with an exemplary embodiment of the present inventive concept, a device assembly includes a chip-on-film (COF) package including a film substrate on which a plurality of film-through wires are formed. The COF package includes a panel unit including a panel substrate on which a plurality of panel-through wires are formed. The panel unit is disposed on the COF package and one end of the panel unit is electrically connected to a first end of the COF package. A control unit is disposed below the panel unit and the control unit is electrically connected to a second end of the COF package.

In accordance with an exemplary embodiment of the present inventive concept, a plurality of first film wires may be formed on a first surface of the film substrate. A plurality of second film wires may be formed on a second surface of the film substrate corresponding to the plurality of first film wires. A semiconductor chip may be disposed on the plurality of first film wires. The plurality of film-through wires may vertically pass through the film substrate electrically connecting the plurality of first film wires and the plurality of second film wires, respectively.

In accordance with an exemplary embodiment of the present inventive concept, the pluralities of first and second film wires may include first and second input film wires configured to receive a signal from the control unit, and transmit the signal to the semiconductor chip. The pluralities of first and second film wires may include first and second output film wires configured to output a signal processed by the semiconductor chip to the panel unit and first and second bypass film wires configured to bypass the semiconductor chip and output a signal received from the control unit to the panel unit.

In accordance with an exemplary embodiment of the present inventive concept, the plurality of film-through wires may include output film-through wires configured to electrically connect the first output film wires and the second output film wires. The plurality of film-through wires may include bypass film-through wires configured to electrically connect the first bypass film wires and the second bypass film wires. The output film-through wires may be spaced by a first distance from an output end of the film substrate and the bypass film-through wires may be spaced by a second distance from the output end of the film substrate. The first distance may be shorter than the second distance.

In accordance with an exemplary embodiment of the present inventive concept, the output film-through wires may include a first output film-through wire spaced by the first distance from the output end of the film substrate and a second output film-through wire spaced by a third distance from the output end of the film substrate. The third distance may be longer than the first distance.

In accordance with an exemplary embodiment of the present inventive concept, the bypass film-through wires may include a first bypass film-through wire spaced by a fourth distance from the output end of the film substrate. The bypass film-through wires may include a second bypass film-through wire spaced by a fifth distance from the output end of the film substrate. The bypass film-through wires may include a third bypass film-through wire spaced by a sixth distance from the output end of the film substrate. The fourth, fifth, and sixth distances may be longer than the first distance and the fifth distance may be longer than the fourth distance, and shorter than the sixth distance.

In accordance with an exemplary embodiment of the present inventive concept, the panel unit may include a display panel disposed on a first surface of the panel substrate, the display panel configured to display an image. The panel unit may include a plurality of first panel wires formed on the first surface of the panel substrate. The plurality of first panel wires may correspond to the pluralities of first and second film wires. The panel unit may include a plurality of second panel wires formed on a second surface of the panel substrate. The plurality of second panel wires may correspond to the plurality of first panel wires. The plurality of panel-through wires may vertically pass through the panel substrate and the plurality of panel-through wires may electrically connect the plurality of first panel wires and the plurality of second panel wires, respectively.

In accordance with exemplary embodiments of the present inventive concept the display panel may be an organic light-emitting panel (OLED) or a liquid crystal panel (LCD).

In accordance with an exemplary embodiment of the present inventive concept the pluralities of first and second panel wires may include first and second input panel wires configured to receive a signal supplied from the semiconductor chip and first and second bypass panel wires configured to directly receive a signal supplied from the control unit while bypassing the COF package.

In accordance with an exemplary embodiment of the present inventive concept the plurality of panel-through wires may include input panel-through wires configured to electrically connect the first input panel wires and the second input panel wires and bypass panel-through wires configured to electrically connect the first bypass panel wires and the second bypass panel wires.

In accordance with an exemplary embodiment of the present inventive concept the control unit may include a circuit hoard, wherein one end of the circuit board is disposed on the plurality of first film wires. The control unit may include a wire pattern formed on the circuit board, the wire pattern electrically connected to the plurality of first film wires and a circuit device disposed on the wire pattern.

In accordance with an exemplary embodiment of the present inventive concept the film substrate and the panel substrate may be flexible.

In accordance with an exemplary embodiment of the present inventive concept, a COF package includes a film substrate including a first surface and a second surface that face each other. The COF package includes a plurality of first film wires formed on the first surface and a plurality of second film wires formed on the second surface to correspond to the plurality of first film wires. The COF package includes a semiconductor chip disposed on the plurality of first film wires or the plurality of second film wires. A plurality of film-through wires are formed on the film substrate to electrically connect the plurality of first film wires and the plurality of second film wires, respectively.

In accordance with an exemplary embodiment of the present inventive concept, the pluralities of first and second film wires may include first and second input film wires configured to receive a signal from the control unit and transmit the signal to the semiconductor chip. The pluralities of first and second film wires may include first and second output film wires configured to output a signal processed by the semiconductor chip and first and second bypass film wires configured to bypass the semiconductor chip and output a signal received from the control unit.

In accordance with an exemplary embodiment of the present inventive concept, the plurality of film-through wires may include output film-through wires configured to electrically connect the first output film wires and the second output film wires. The plurality of film-through wires may include bypass film-through wires configured to electrically connect the first bypass film wires and the second bypass film wires. The output film-through wires may be spaced by a first distance from an output end of the film substrate. The bypass film-through wires may be spaced by a second distance from the output end of the film substrate. The first distance may be shorter than the second distance.

BRIEF DESCRIPTION OF THE DRAWINGS

The above and other features of the inventive concept will become more apparent by describing in detail exemplary embodiments thereof, with reference to the accompanying drawings in which:

FIGS. 5A and 5B are schematic cross-sectional views of one end of a device assembly in accordance with an exemplary embodiment of the present inventive concept.

DETAILED DESCRIPTION OP THE EMBODIMENTS

Figure 1A:
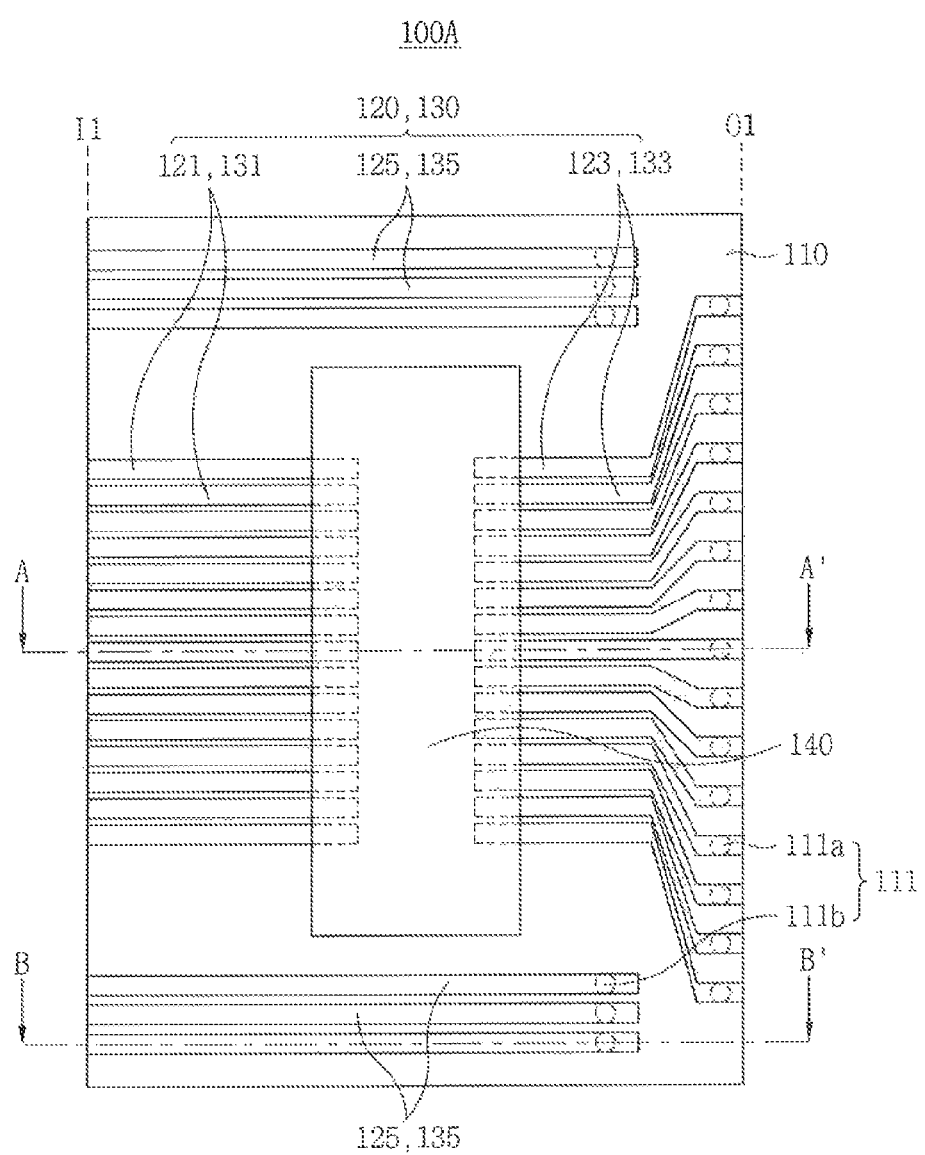
FIG. 1A is a top view of a chip-on-film (COF) package in accordance with an exemplary embodiment of the present inventive concept.

Hereinafter, exemplary embodiments of the present inventive concept will be described in detail with reference to the accompanying drawings. However, the present inventive concept should not be construed as limited to the exemplary embodiments set forth herein and may be embodied in different forms.

As used herein, the singular forms "a," "an" and "the" are intended to include the plural forms as well, unless the context clearly indicates otherwise.

It will be understood that when an element or layer is referred to as being "on," "connected to," or "coupled to" another element or layer, it can be directly on, connected to, or coupled to the other element or layer, or intervening elements or layers may be present. The same reference numerals may represent the same elements throughout the specification and drawings.

Figure 1B:
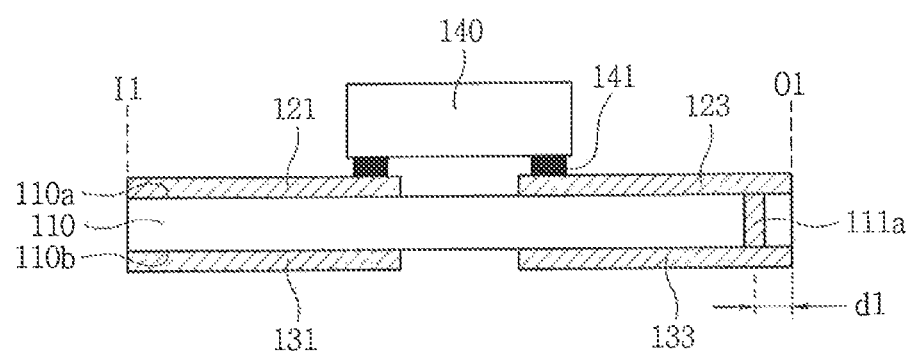
FIGS. 1B and 1D are cross-sectional views taken along line A-A' of FIG. 1A.
Figure 1C:
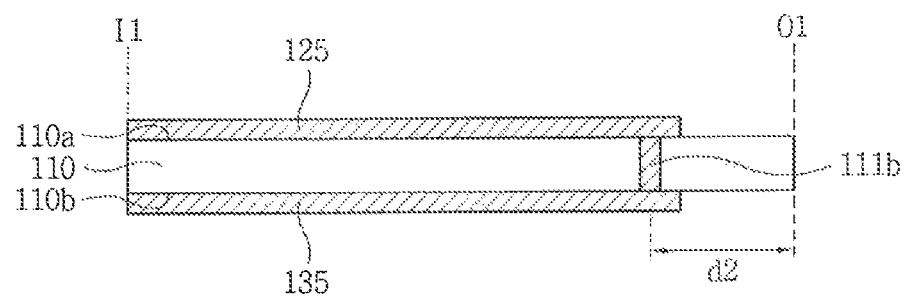
FIGS. 1C and 1E are cross-sectional views taken along line B-B' of FIG. 1A.
Figure 1D:
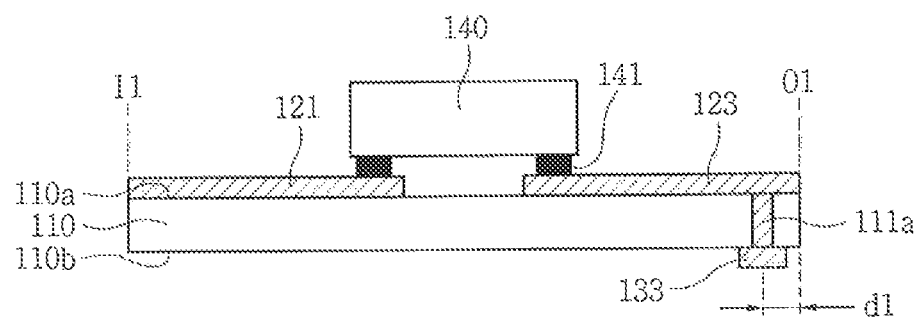
Figure 1E:
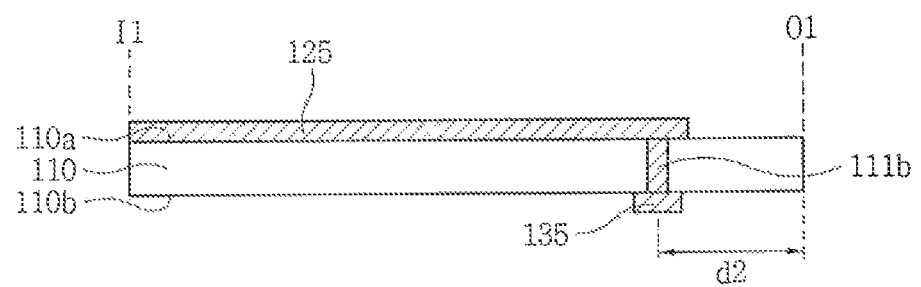

In the drawings, the sizes and relative sizes of layers and regions may be exaggerated for clarity. FIG. 1A is a top view of a chip-on-film (COF) package 100A in accordance with an exemplary embodiment of the present inventive concept. FIGS. 1B and 1D are cross-sectional views taken along line A-A' of FIG. 1A. FIGS. 1C and 1E are cross-sectional views taken along line B-B' of FIG. 1A.

Referring to FIGS. 1A to 1C, the COF package 100A according to an exemplary embodiment of the present inventive concept may include a film substrate 110 with a first surface 110a and a second surface 110b that face each other. The COF package 100A may include a plurality of first film wires 120 formed on the first surface 110a. The COF package 100A may include a plurality of second film wires 130 formed on the second surface 110b. The COF package 100A may include a semiconductor chip 140 disposed on the plurality of first film wires 120 or the plurality of second film wires 130. A plurality of film-through wires 111 may be formed on the film substrate 110. The plurality of film-through wires 111 may electrically connect the plurality of first film wires 120 and the plurality of second film wires 130, respectively.

The film substrate 110 may be formed of, for example, a resin-based material such as polyimide or polyester. The film substrate 110 may be flexible.

The plurality of first film wires 120 and the plurality of second film wires 130 may be formed to correspond to one another. For example, the plurality of first film wires 120 may include a first input film wire 121 via which a signal that is to be supplied to the semiconductor chip 140 is received, a first output film wire 123 via which a signal processed by the semiconductor chip 140 is output, and a first bypass film wire 125 via which an input signal is bypassed and output. The plurality of second film wires 130 may include a second input film wire 131 corresponding to the first input film wire 121, a second output film wire 133 corresponding to the first output film wire 123, and a second bypass film wire 135 corresponding to the first bypass film wire 125.

The pluralities of first and second film wires 120 and 130 may be formed of a conducting metal, e.g., copper (Cu). Although not specifically shown, input/output (I/O) terminals may be disposed on the pluralities of first and second film wires 120 and 130, respectively. The pluralities of first and second film wires 120 and 130, except for the I/O terminals, may be protected by being covered with an insulating film.

The plurality of film-through wires 111 formed on the film substrate 110 may electrically connect the plurality of first film wires 120 and the plurality of second film wires 130, respectively. The plurality of film-through wires 111 may include, for example, an output film-through wire 111a. The output film-through wire 111a may electrically connect the first output film wire 123 and the second output film wire 133. The plurality of film-through wires 111 may include, for example, a bypass film-through wire 111b that electrically connects the first bypass film wire 125 and the second bypass film wire 135. The output film-through wire 111a may be formed to be closer to an output end O1 of the film substrate 110 than the bypass film-through wire 111b. For example, the output film-through wire 111a may be spaced by a first distance d1 from the output end O1 of the film substrate 110, and the bypass film-through wire 111b may be spaced by a second distance d2 from the output end O1 of the film substrate 110. The first distance d1 may be shorter than the second distance d2, e.g., d1<d2.

The plurality of film-through wires 111 may be formed, for example, by forming through-holes vertically passing through portions of the film substrate 110 on which the first film wires 120 and the second film wires 130 that correspond to each other are formed, and filling the insides of the through-holes with a conductive material.

Referring to FIGS. 1D and 1E, one of the first and second input film wires 121 and 131 (e.g., the second input film wire 131) might not be formed on a surface (e.g., the second surface 110b) of the film substrate 110 on which the semiconductor chip 140 is not disposed. One of the first and second output film wires 123 and 133 (e.g., the second output film wire 133) and one of the first and second bypass film wires 125 and 135 (e.g., the second bypass film wire 135) may be partially formed on locations on which the film-through wires 111 are disposed.

A plurality of bumps 141 may be formed on the semiconductor chip 140, e.g., a bottom surface of the semiconductor chip 140. The bumps 141 may correspond to the plurality of first film wires 120 or the plurality of second film wires 130. The semiconductor chip 140 may be flip-chip bonded using a tape automated bonding (TAB) process of arranging the plurality of bumps 141 on the plurality of first film wires 120 or the plurality of second film wires 130, and thermally compression bonding the plurality of bumps 141.

Figure 2A:
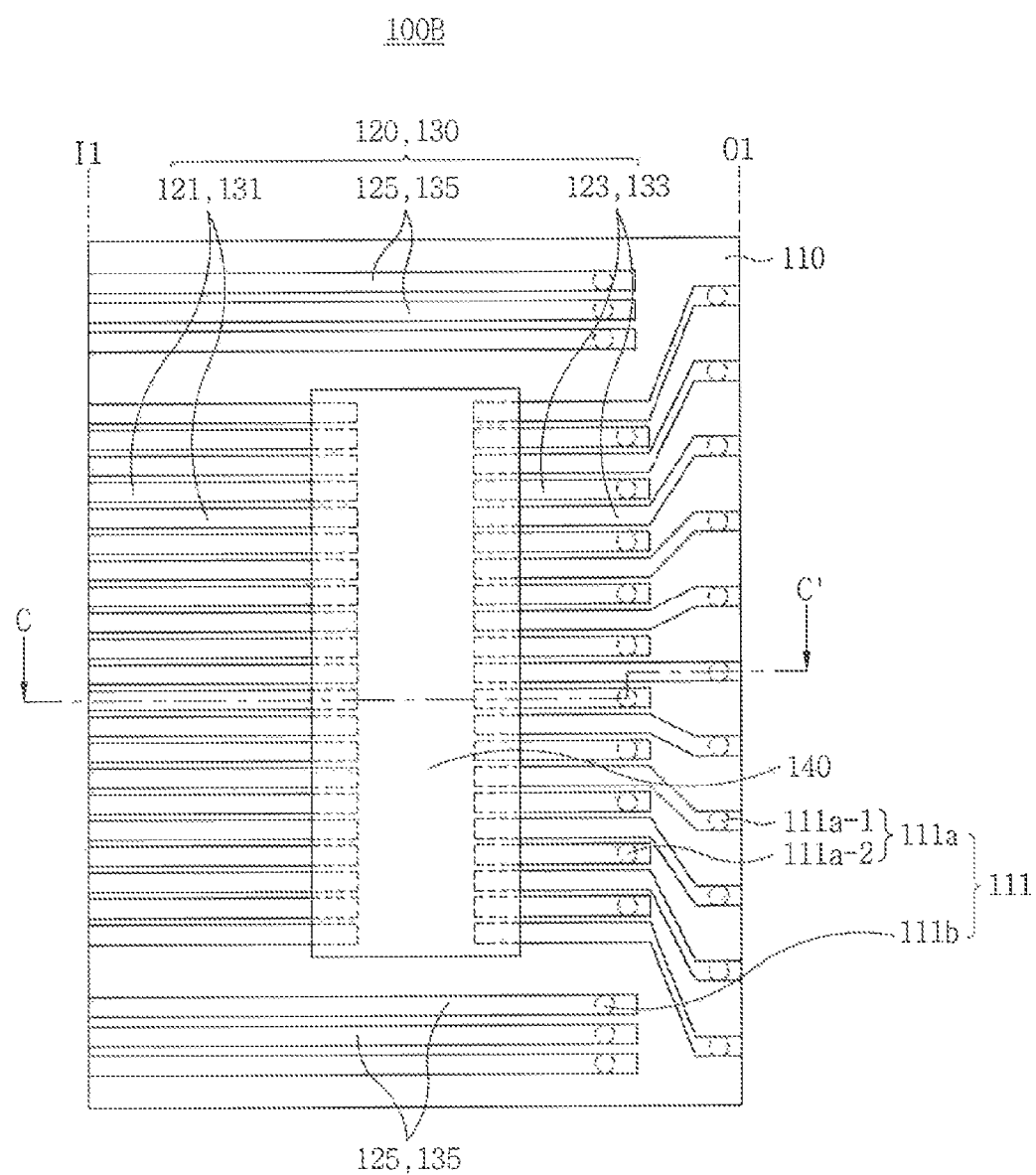
FIG. 2A is a top view of a COF package in accordance with an exemplary embodiment of the present inventive concept.
Figure 2B:
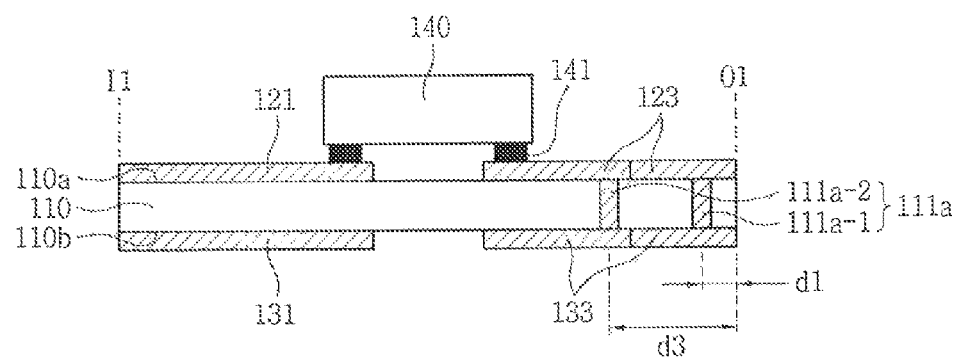
FIGS. 2B and 2C are cross-sectional views taken along line C-C' of FIG. 2A.
Figure 2C:
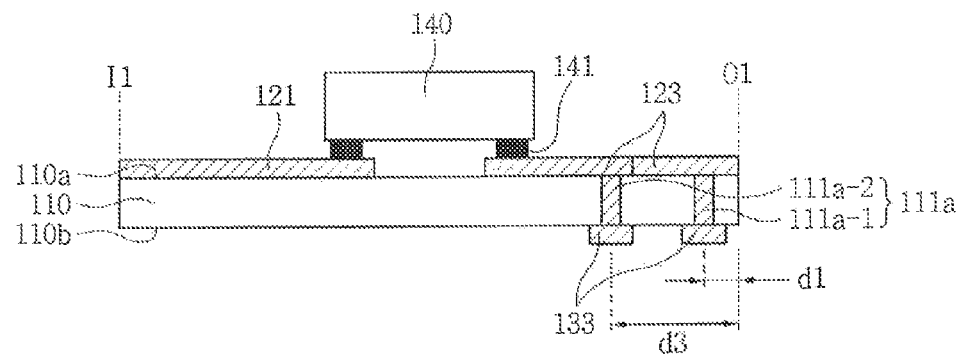

FIG. 2A is a top view of a COF package 100B in accordance with an exemplary embodiment of the present inventive concept. FIGS. 2B and 2C are cross-sectional views taken along line C-C' of FIG. 2A. The COF package 100B in accordance with an exemplary embodiment of the present inventive concept is the same as the COF package 100A in accordance with the exemplary embodiment of the present inventive concept of FIG. 1, except for the number and arrangement of output film-through wires 111a. In the COF package 100B, the same elements as those in the COF package 100A are as described above with reference to FIGS. 1A to 1E.

Referring to FIGS. 2A to 2C, in the COF package 100B in accordance with an exemplary embodiment of the present inventive concept, as the number of first and second input film wires 121 and 131 and first and second output film wires 123 and 133 increases, the distances between the output film-through wires 111a and an output end O1 of a film substrate 110 may change. The increase in the number of the first and second input film wires 121 and 131 and the first and second output film wires 123 and 133 may increase the number of channels. For example, the output film-through wires 111a may include a first output film-through wire 111a-1 spaced by a first distance d1 from the output end O1 of the film substrate 110, and a second output film-through wire 111a-2 spaced by a third distance d3 from the output end O1 of the film substrate 110. The third distance d3 may be longer than the first distance d1, e.g., d3>d1.

Figure 3A:
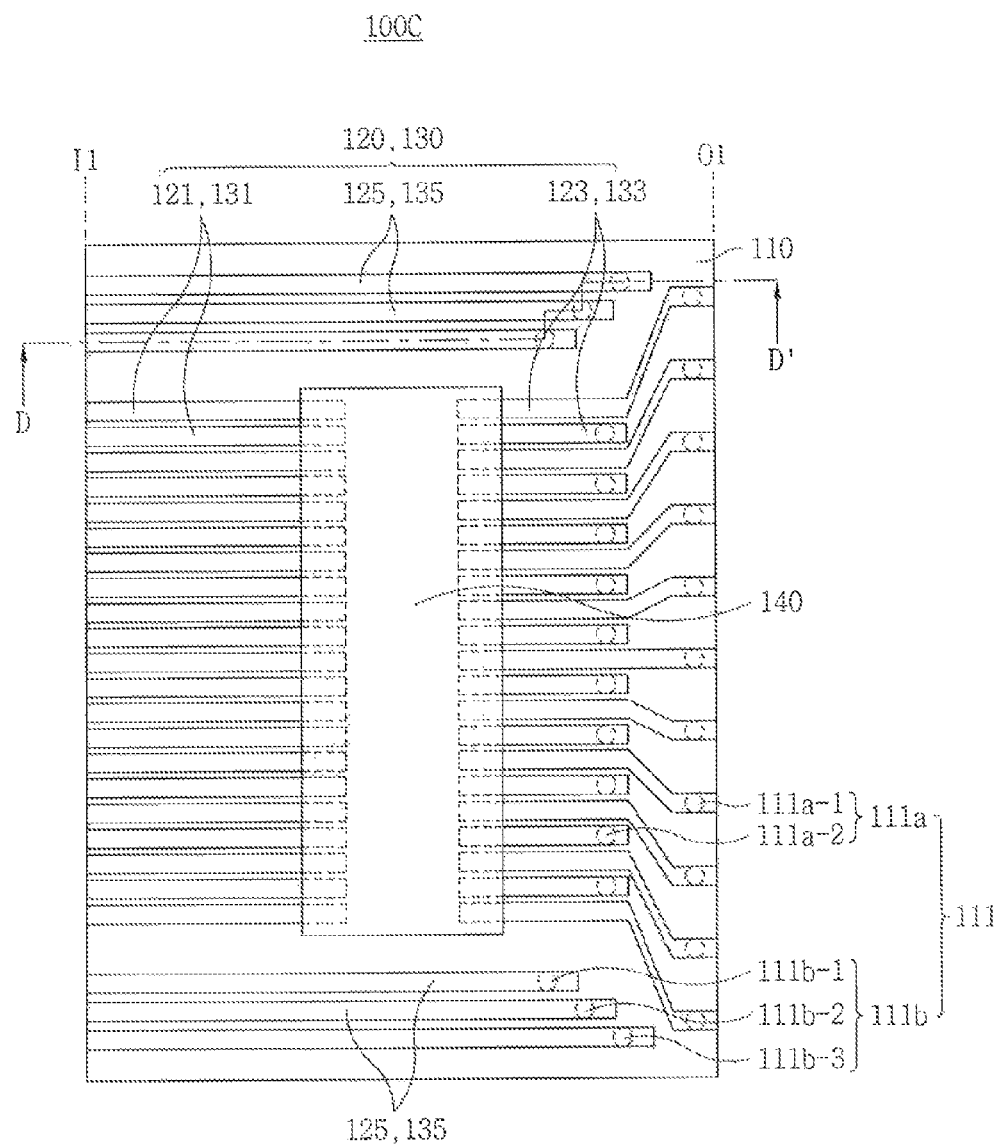
FIG. 3A is a top view of a COF package in accordance with an exemplary embodiment of the present inventive concept.
Figure 3B:
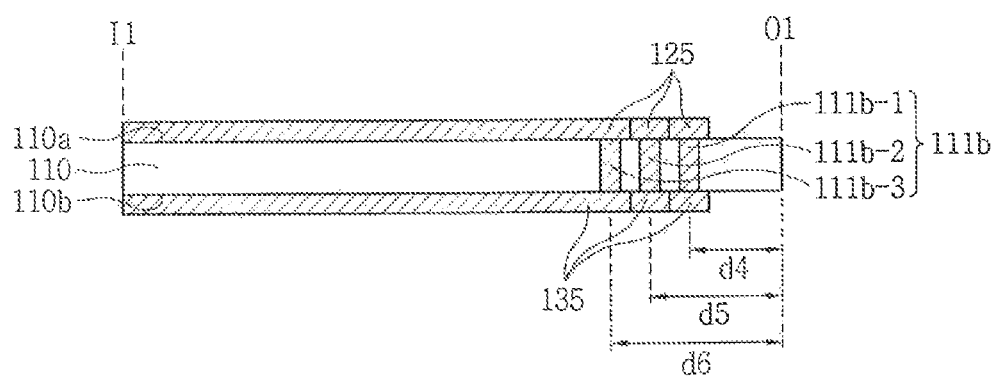
FIGS. 3B and 3C are cross-sectional views taken along line D-D' of FIG. 3A.
Figure 3C:
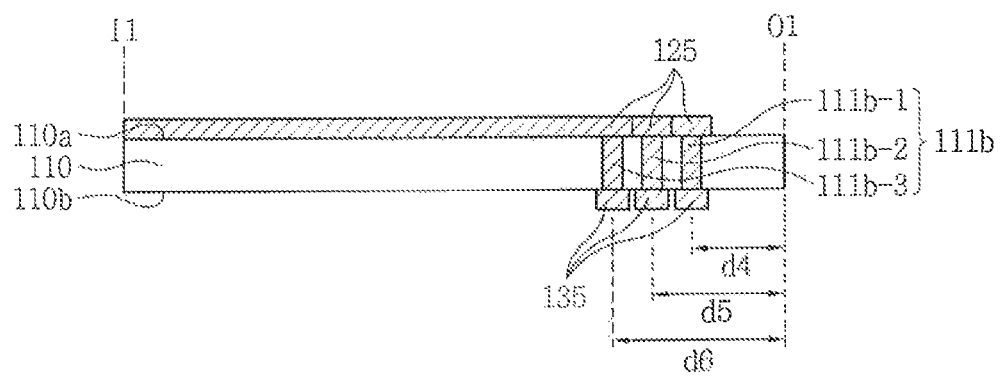

FIG. 3A is a top view of a COF package 100C in accordance with an exemplary embodiment of the present inventive concept, FIGS. 3B and 3C are cross-sectional views taken along line D-D' of FIG. 3A. The COF package 100C in accordance with an exemplary embodiment of the present inventive concept is the same as the COF package 100B in accordance with the exemplary embodiment of the present inventive concept of FIG. 2, except for the number and arrangement of bypass film-through wires 111b. In the COF package 100C, the same elements as those in the COF package 100C are as described above with reference to FIGS. 2A to 2C.

Referring to FIGS. 3A to 3C, in the COF package 100C in accordance with an exemplary embodiment of the present inventive concept, the distances between the bypass film-through wires 111b and an output end O1 of a film substrate 110 may be different, similar to the output film-through wires 111a of FIGS. 2A to 2C. For example, the bypass film-through wires 111b may include a first bypass film-through wire 111b-1 spaced by a fourth distance d4 from the output end O1 of the film substrate 110, a second bypass film-through wire 111b-2 spaced by a fifth distance d5 from the output end O1 of the film substrate 110, and a third bypass film-through wire 111b-3 spaced by a sixth distance d6 from the output end O1 of the film substrate 110. The fourth distance d4, the fifth distance d5, and the sixth distance d6 may be longer than the first distance d1, e.g., d4>d1, d5>d1, and d6>d1. In addition, the fifth distance d5 may be longer than the fourth distance d4, and shorter than the sixth distance d6, e.g., d4<d5<d6.

In the COF packages 100A, 100B, and 100C in accordance with the exemplary embodiments of the present inventive concept, the plurality of first film wires 120 may be disposed on the first surface 110a of the film substrate 110. The semiconductor chip 140 may be disposed on the first surface 110a of the film substrate 110. The plurality of second film wires 130 may be disposed on the second surface 110b of the film substrate 110, on which the first semiconductor chip 140 is not disposed. The plurality of first film wires 120 and the plurality of second film wires 130 may be electrically connected by the plurality of film-through wires 111. In this way, the COF packages 100A, 100B, and 100C each have a 2-layer structure in which the first and second film wires 120 and 130 are disposed on the first and second surfaces 110a and 110b of the film substrate 110. The first and second film wires 120 and 130 may be formed of a metal. Thus, the semiconductor chip 140 may be freely positioned. For example, one end of a panel unit 200 and one end of a control unit 300, which will be described below, may be connected to a top or bottom surface of one end of each of the COF packages 100A, 100B, and 100C, and the degree of freedom of the chip's location may be increased during a device assembly process. The pluralities of first and second film wires 120 and 130 may have higher thermal conductivity than the film substrate 110 and are thus capable of efficiently discharging heat generated by the semiconductor chip 140. The semiconductor chip 140 may be dually protected in a subsequent process, and be resistant to electromagnetic interference (EMI), due to the 2-layer structure.

FIGS. 4A to 4D are schematic cross-sectional views of one end of a device assembly 1000A in accordance with an exemplary embodiment of the present inventive concept.

Figure 4A:
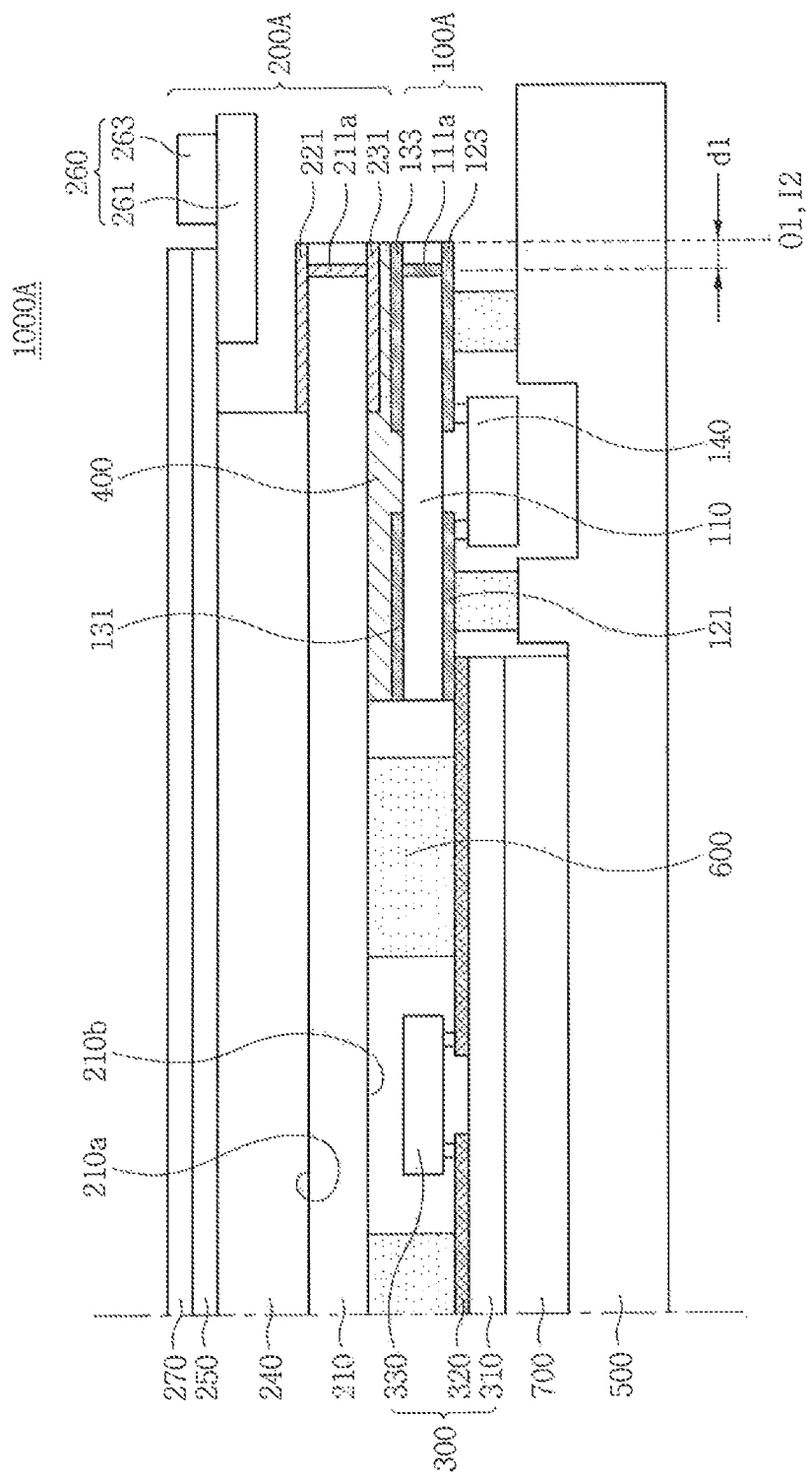
FIGS. 4A to 4D are schematic cross-sectional views of one end of a device assembly in accordance with an exemplary embodiment of the present inventive concept.
Figure 4B:
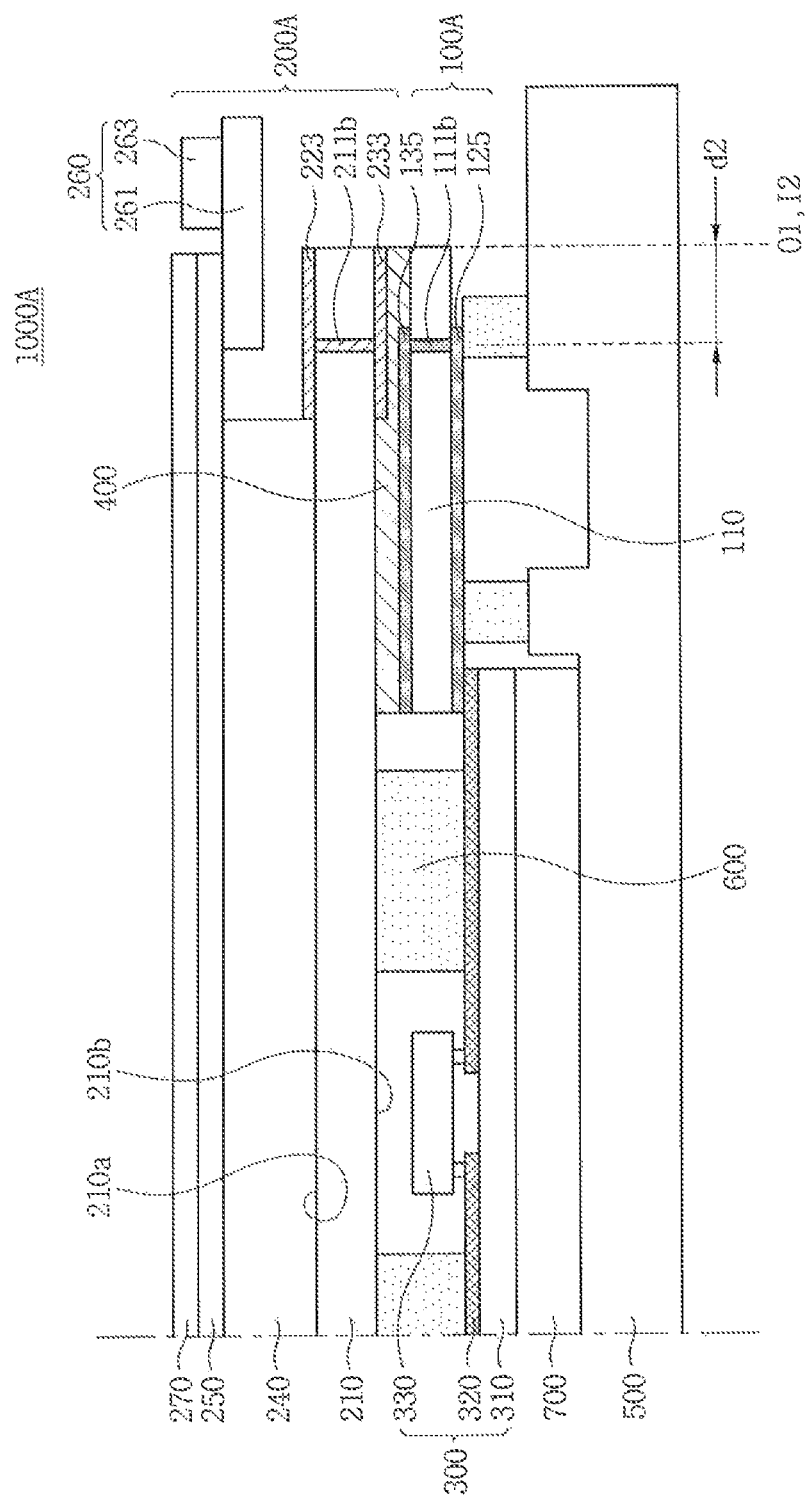

Referring to FIGS. 4A and 4B, the device assembly 1000A in accordance with an exemplary embodiment of the present inventive concept may include a COF package disposed on a lower frame 500. The device assembly 1000A may include a panel unit 200A and a control unit 300 that are electrically connected to two ends of the COF package, respectively. The device assembly 1000A may be a display device assembly. The COF package may be the same as the COF package 100A described above with reference to FIGS. 1A to 1E.

The lower frame 500 may fix the panel unit 200A while surrounding external sides of the COF package 100A, the panel unit 200A, and the control unit 300.

The COF package 100A may include a film substrate 110 on which a plurality of film-through wires 111 are formed, a plurality of first film wires 120 formed on a first surface 110a of the film substrate 110, a plurality of second film wires 130 formed on a second surface 110b of the film substrate 110, and a semiconductor chip 140 disposed on the plurality of first film wires 120.

The film substrate 110 may be formed of, for example, a resin-based material such as polyimide or polyester. The film substrate 110 may be flexible.

The plurality of first film wires 120 and the plurality of second film wires 130 may be formed to correspond to one another. The plurality of first film wires 120 may include, for example, a first input film wire 121 via which a signal that is to be supplied from the control unit 300 to the semiconductor chip 140 is received, a first output film wire 123 via which a signal processed by the semiconductor chip 140 is output to the panel unit 200A, and a first bypass film wire 125 via which a signal (e.g., a power supply signal) input from the control unit 300 is bypassed and output to the panel unit 200A. The plurality of second film wires 130 may include a second input film wire 131 corresponding to the first input film wire 121, a second output film wire 133 corresponding to the first output film wire 123, and a second bypass film wire 135 corresponding to the first bypass film wire 125.

The pluralities of first and second film wires 120 and 130 may be formed of a conductive metal, e.g., copper (Cu). Although not specifically shown, input/output (I/O) terminals may be disposed on the pluralities of first and second film wires 120 and 130, and the pluralities of first and second film wires 120 and 130, except for the I/O terminals, may be protected by being covered with an insulating film.

The plurality of film-through wires 111 formed on the film substrate 110 may electrically connect the plurality of first film wires 120 and the plurality of second film wires 130, respectively. The plurality of film-through wires 111 may include, for example, an output film-through wire 111a. The output film-through wire 111a may electrically connect the first output film wire 123 and the second output film wire 133. The plurality of film-through wires 111 may include, for example, a bypass film-through wire 111b that electrically connects the first bypass film wire 125 and the second bypass film wire 135. The output film-through wire 111a may be disposed to be closer to an output end O1 of the film substrate 110 than the bypass film-through wire 111b. For example, the output film-through wire 111a may be spaced by a first distance d1 from the output end O1 of the film substrate 110, and the bypass film-through wire 111b may be spaced by a second distance d2 from the output end O1 of the film substrate 110. The first distance d1 may be shorter than the second distance d2, e.g., d1<d2.

The plurality of film-through wires 111 may be formed, for example, by forming through-holes vertically passing through portions of the film substrate 110 on which the first film wires 120 and the second film wires 130 that correspond to each other are formed, and filling the insides of the through-holes with a conductive material.

Figure 4C:
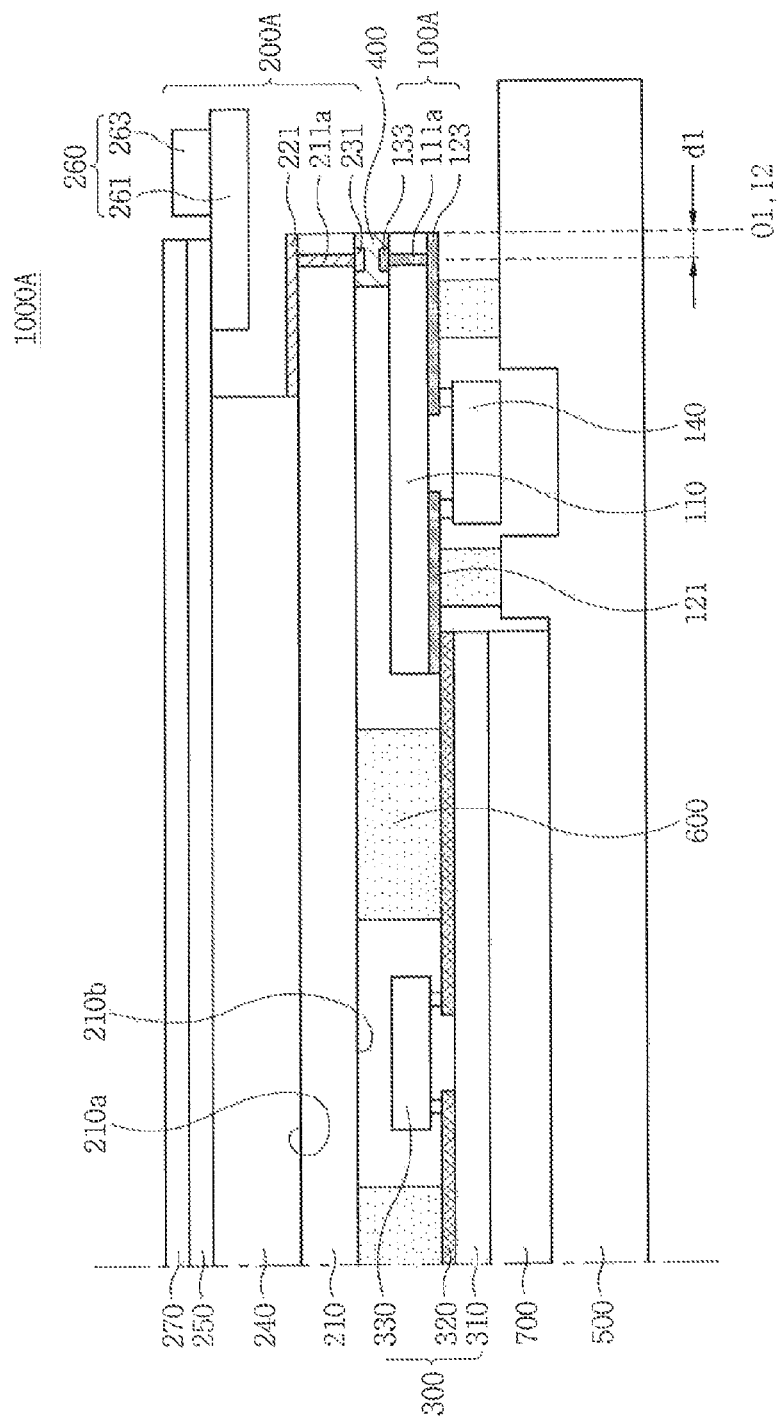
Figure 4D:
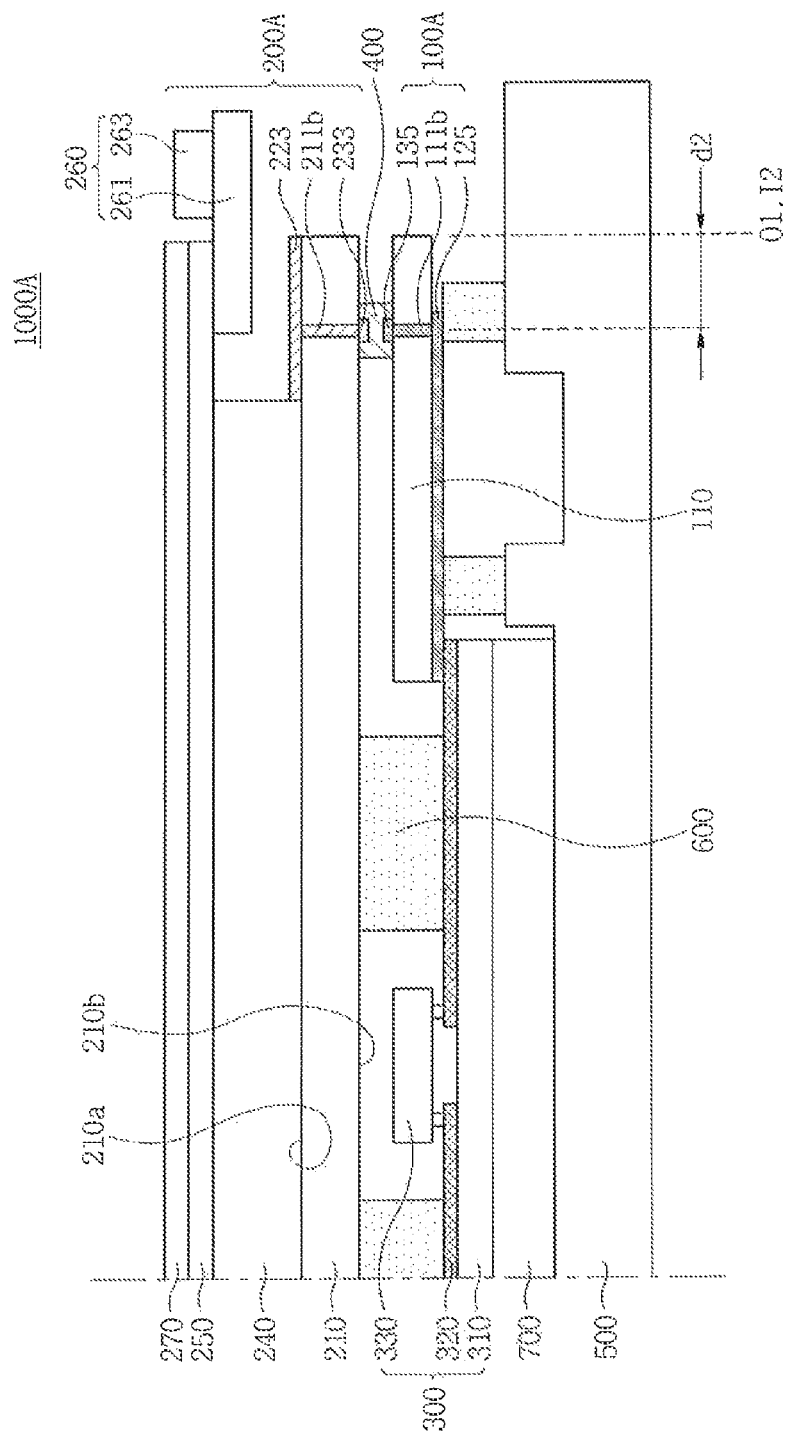

Referring to FIGS. 4C and 4D, the second input film wire 131 might not be disposed on the second surface 110b on which the semiconductor chip 140 is not disposed, and the output film wire 133 and the bypass film wires 135 may be partially formed only on locations on which the film-through wires 111a are disposed.

On the semiconductor chip 140, e.g., a bottom surface of the semiconductor chip 140, a plurality of bumps 141 may be formed. The plurality of bumps 141 may correspond to the plurality of first film wires 120. The semiconductor chip 140 may be flip-chip bonded using a TAB process of arranging the plurality of humps 141 on the plurality of first film wires 120, and thermally compression bonding the plurality of bumps 141. The semiconductor chip 140 may be, for example, a gate driving integrated circuit (IC) configured to supply a gate driving signal to the panel unit 200A to drive a gate line of the panel unit 200A. The semiconductor chip 140 may be a data driving IC configured to supply a data driving signal to the panel unit 200A to drive a data line of the panel unit 200A, according to, for example, a control signal output from the control unit 300.

As illustrated in FIGS. 4A and 4B, the panel unit 200A may include a panel substrate 210 on which a plurality of panel-through wires 211 are formed. The panel unit 200A may be disposed on the COF package 100A such that one end (e.g., an input end I2) of the panel unit 200A is electrically connected to first end (e.g., an output end O1) of the COF package 100A. The panel unit 200A may include a display panel 240 disposed on a first surface 210a of the panel substrate 210 to display an image. The panel unit 200A may include a plurality of first panel wires 220 disposed on the first surface 210a of the panel substrate 210 to deliver a signal to the display panel 240. The panel unit 200A may include a plurality of second panel wires 230 disposed on a second surface 210b of the panel substrate 210. The plurality of second panel wires 230 may correspond to the plurality of first panel wires 220.

The panel substrate 210 may be formed of for example, a resin-based material such as polyimide or polyester. The panel substrate 210 may be flexible. When the panel substrate 210 is formed of a flexible material, the device assembly may be embodied as a flexible display. The panel substrate 210 may be a glass substrate.

The pluralities of first and second panel wires 220 and 230 may be formed to correspond to each other. The plurality of first panel wires 220 may be formed to correspond to the plurality of first film wires 120, and the plurality of second panel wires 230 may be formed to correspond to the plurality of second film wires 130. The plurality of first panel wires 220 may include, for example, a first input panel wire 221 via which a signal (e.g., a panel driving signal) supplied from the semiconductor chip 140 of the COF package 100A is received, and a first bypass panel wire 223 via which a signal (e.g., a power supply signal) directly supplied from the control unit 300 is received while bypassing the COF package 100A. The plurality of second panel wires 230 may include a second input panel wire 231 corresponding to the first input panel wire 221, and a second bypass film wire 233 corresponding to the first bypass panel wire 223. The first and second input panel wires 221 and 231 may include first and second gate line panel wires connected to a gate driving line of the display panel 240, and first and second data line panel wires connected to a data driving line of the display panel 240.

The pluralities of first and second panel wires 220 and 230 may be formed as a transparent electrode. The pluralities of first and second panel wires 220 and 230 may include, for example, an indium tin oxide (ITO).

The plurality of panel-through wires 211 formed on the panel substrate 210 may electrically connect the plurality of first panel wires 220 and the plurality of second panel wires 230, respectively. For example, the plurality of panel-through wires 211 may include an input panel-through wire 211a that electrically connects the first input panel wire 221 and the second input panel wire 231. The plurality of panel-through wires 211 may include as bypass panel-through wire 211b that electrically connects the first bypass panel wire 223 and the second bypass film wire 233. The input panel-through wire 211a may be positioned closer to the input end I2 of the panel substrate 210 than the bypass panel-through wire 211b. For example, the input panel-through wire 211a may be spaced by a first distance d1 from the input end I2 of the panel substrate 210, and the bypass panel-through wire 211b may be spaced by a second distance d2 from the input end I2 of the panel substrate 210. The first distance d1 may be shorter than the second distance d2, e.g., d1<d2.

The plurality of panel-through wires 211 may be formed, for example, by forming through-holes vertically passing through portions of the panel substrate 210 on which the first panel wires 220 and the second panel wires 230 that correspond to each other are formed, and filling the insides of the through-holes with a conductive material.

The panel unit 200A may be disposed such that the second film wires 130 and the second panel wires 230 contact each other. The second film wires 130 and the second panel wires 230 may be bonded via a conductive adhesive 400. For example, the conductive adhesive 400 may include an anisotropic conductive film (ACF).

As illustrated in FIGS. 4C and 4D, the second panel wires 230 of the panel unit 200A may be partially formed only on locations on which the panel-through wires 211 are disposed.

The display panel 240 may display an image thereon according to a gate driving signal and a data driving signal received from the semiconductor chip 140. The display panel 240 may be, for example, an organic light-emitting panel (OLED) or a liquid crystal panel (LCD), but the display panel 240 is not limited thereto. For example, when the display panel 240 is an OLED, the display panel 240 may include an organic light-emitting device. The organic light-emitting device may include a light-emitting material that provides electro luminescence (EL). The organic light-emitting device may be a passive-matrix/active-matrix organic light-emitting device. As another example, although not shown, the display panel 240 may include a thin-film transistor substrate and a color filter substrate that face each other when the display panel 240 is an LCD. When, for example, liquid crystal is injected between the thin-film transistor substrate and the color filter substrate, an image may be displayed by controlling the light transmittance of the liquid crystal using a thin film transistor (TFT) which is a switching device having the form of a matrix. In the LCD case, a backlight assembly (not shown) configured to provide light may further be disposed on the display panel 240.

The panel unit 200A may further include a touch panel 250 and a protective film 270 on the display panel 240. Although not shown, the touch panel 250 may include at least one touch sensitive device. The at least one touch sensitive device may include a plurality of touch driving electrodes and a conductive matrix. A touch driving unit 260 may be disposed on an end of the touch panel 250. The touch driving unit 260 may include a touch panel semiconductor chip 263 configured to control the touch panel 250, and a touch panel connection unit 261 that connects the touch panel semiconductor chip 140 and the touch panel 250. In an exemplary embodiment of the present inventive concept, the touch panel 250 and the protective film 270 may be omitted.

The control unit 300 may be disposed below the panel unit 200A such that one end of the control unit 300 is electrically connected to second end (e.g., an input end I1) of the COF package 100A. The control unit 300 may include a circuit board 310. An end of the circuit board 310 may be disposed on the plurality of first film wires 120. The control unit 300 may include a wire pattern 320 formed on the circuit board 310. The wire pattern 320 may be electrically connected to the plurality of first film wires 120. The control unit 300 may include a circuit device 330 disposed on the wire pattern 320.

The circuit board 310 may be a printed circuit board, e.g., a flexible printed circuit (FPC) board.

The wire pattern 320 may be formed of a conductive metal, e.g., copper (Cu). The first film wires 120 of the COF package 100A may be adhered directly to the wire pattern 320 of the circuit board 310 via a predetermined conductive adhesive. The first film wires 120 may be electrically connected to the wire pattern 320.

The circuit device 330 may be disposed on the wire pattern 320 to perform electric functions according to various signals, respectively. The circuit device 330 may receive various signals from the outside, and output various control signals (e.g. for driving the semiconductor chip 140 included in the COF package 100A). The circuit device 330 may output signals to the semiconductor chip 140. Thus, the semiconductor chip 140 may output a control signal for controlling the display panel 240 of the panel unit 200A according to the various control signals received from the circuit device 330. The circuit device 330 may be, for example, a panel control IC that controls the panel unit 200A by outputting the control signal to the semiconductor chip 140.

An adhesive protective film 600 may be disposed between the film substrate 110 and the lower frame 500 or between the circuit board 310 and the panel substrate 210 to protect the semiconductor chip 140 and the circuit device 330. A protective film 700 may be disposed between the circuit board 310 and the lower frame 500. The adhesive protective film 600 and the protective film 700 may be omitted.

The device assembly 1000A in accordance with an exemplary embodiment of the present inventive concept is electrically connected to two ends of the COF package 100A. For example, the wire pattern 320 of the control unit 300 connected to the input end I1 of the COF package 100A may be electrically connected to the first film wires 120 of the COF package 100A by a predetermined conductive adhesive. The panel unit 200A connected to the output end O1 of the COF package 100A may be electrically connected to the first and second film wires 120 and 130 and the film-through wire(s) 111 of the COF package 100A by the first and second panel wires 220 and 230 and the panel-through ire(s) 211 of the panel unit 200A. Thus, the COF package 100A may electrically connect the panel unit 200A and the control unit 300. The COF package 100A, the panel unit 200A, and the control unit 300 may each act as a driver of a display device.

Figure 5A:
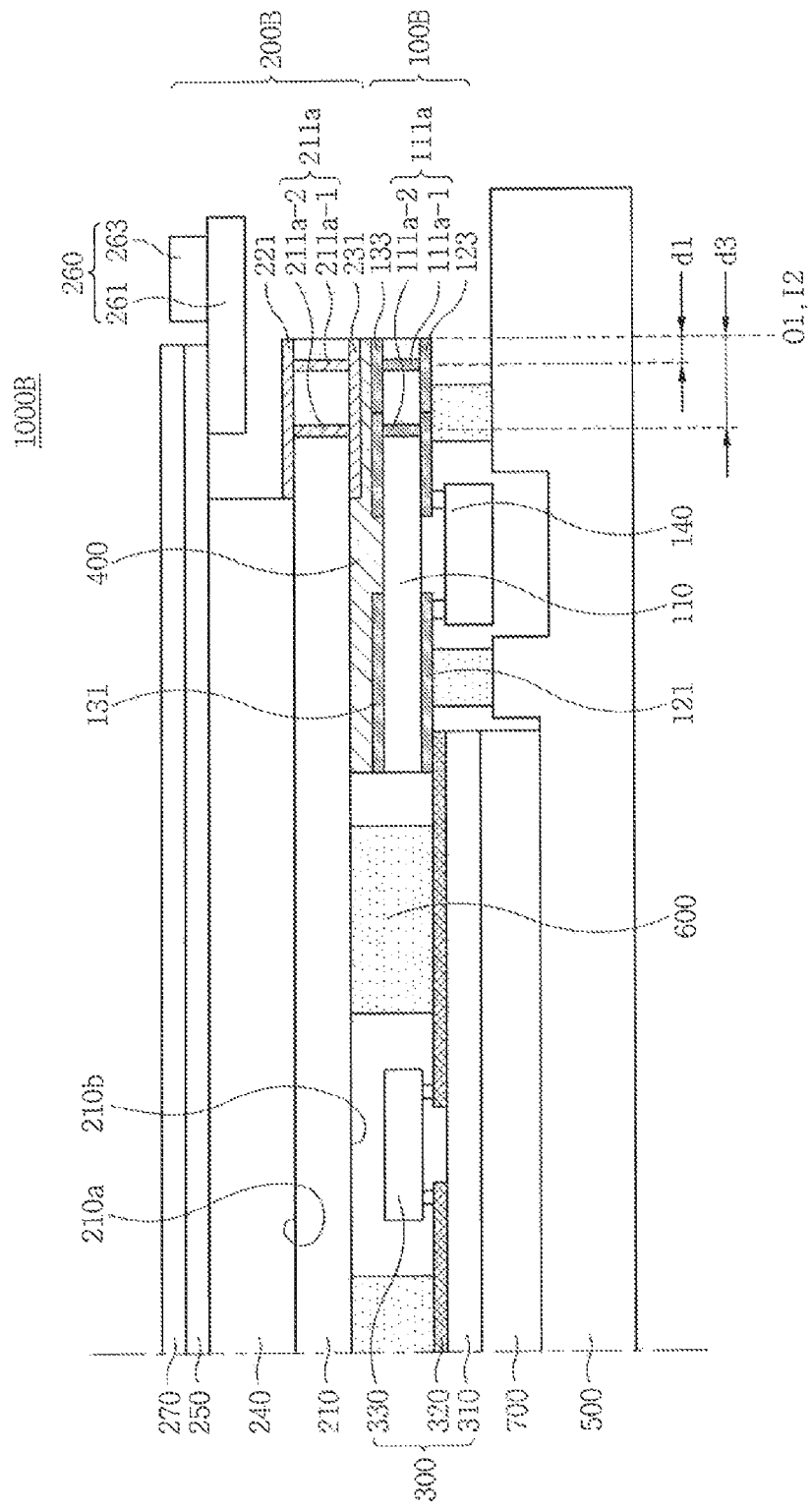

FIGS. 5A and 5B are schematic cross-sectional views of one end of a device assembly 1000B in accordance with an exemplary embodiment of the present inventive concept.

Referring to FIGS. 5A and 5B, the device assembly 1000B in accordance with an exemplary embodiment of the present inventive concept may include a COF package disposed on a lower frame 500. The device assembly 1000B may include a panel unit 200B and a control unit 300 that are electrically connected to two ends of the COF package, respectively. The device assembly 1000B may be a display device assembly.

The COF package may be the same as the COF package 100B described above with reference to FIGS. 2A to 2C.

The device assembly 1000B in accordance with an exemplary embodiment of the present inventive concept is the same as the device assembly 1000A in accordance with the exemplary embodiment of the present inventive concept of FIGS. 4B-4D, except for the arrangement of output film-through wires 111a of the COF package 100B and input panel-through wires 211a of the panel unit 200B. Thus, elements of the device assembly 1000B that are the same as those of the device assembly 1000A will not be described again here.

In the device assembly 1000B in accordance with an exemplary embodiment of the present inventive concept, the distances between the output film-through wires 111a of the COF package 100B and an output end O1 of a film substrate 110 may be different. For example, the output film-through wires 111a may include a first output film-through wire 111a-1 spaced by a first distance d1 from the output end O1 of the film substrate 110, and a second output film-through wire 111a-2 spaced by a third distance d3 from the output end O1 of the film substrate 110. The third distance d3 may be longer than the first distance d1, e.g. d3>d1.

In the device assembly 1000B in accordance with an exemplary embodiment of the present inventive concept, the distances between the input panel-through wires 211a of the panel unit 200B and an input end I2 of the panel substrate 210 may be different. For example, the input panel-through wires 211a may include a first input panel-through wire 211a-1 spaced by a first distance d1 from the input end I2 of the panel substrate 210, and a second input panel-through wire 211a-2 spaced by a third distance d3 from the input end I2 of the panel substrate 210. The third distance d3 may be longer than the first distance d1, d3>d1.

Figure 6A:
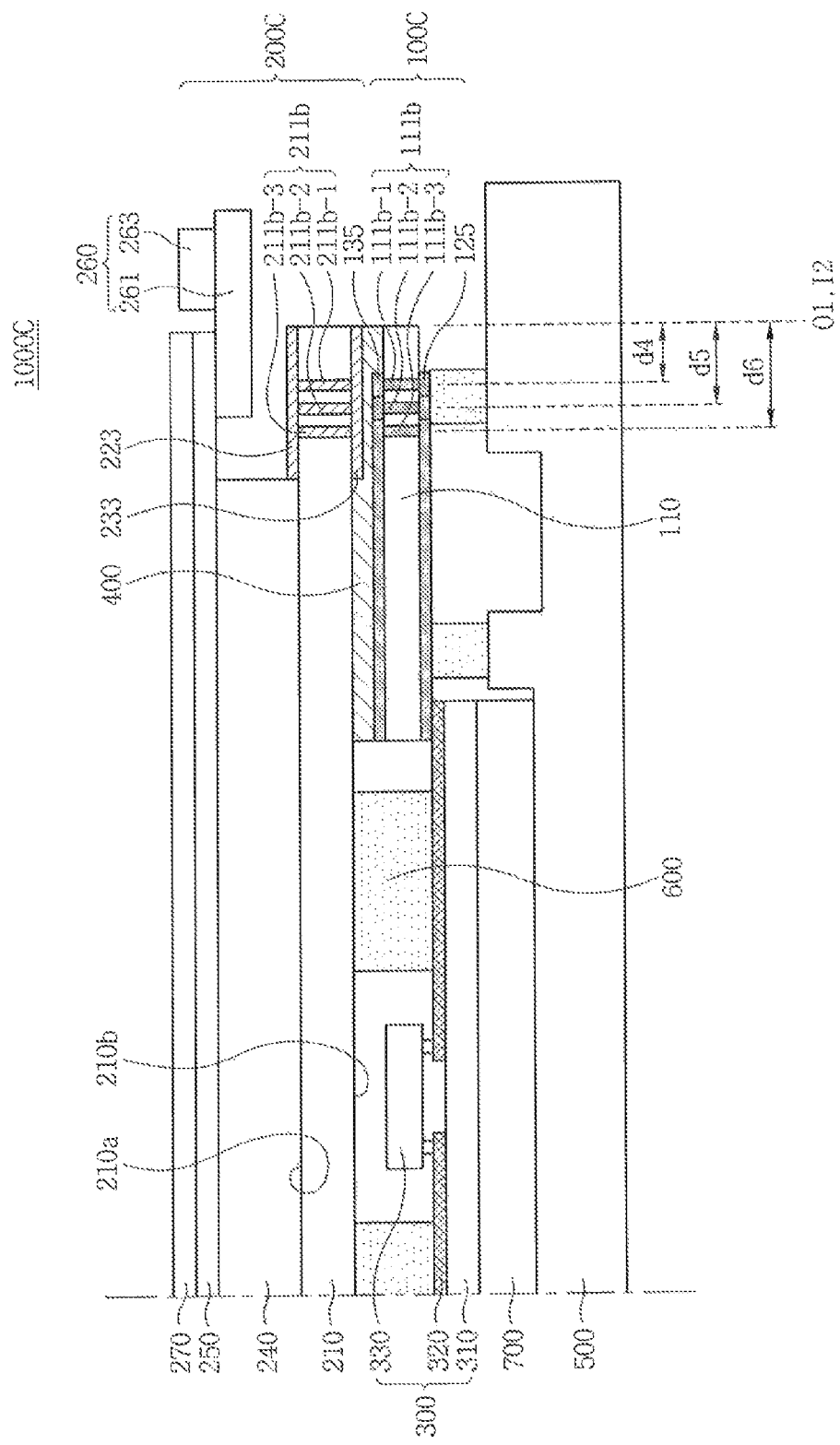
FIGS. 6A and 6B are schematic cross-sectional views of one end of a device assembly in accordance with an exemplary embodiment of the present inventive concept.
Figure 6B:
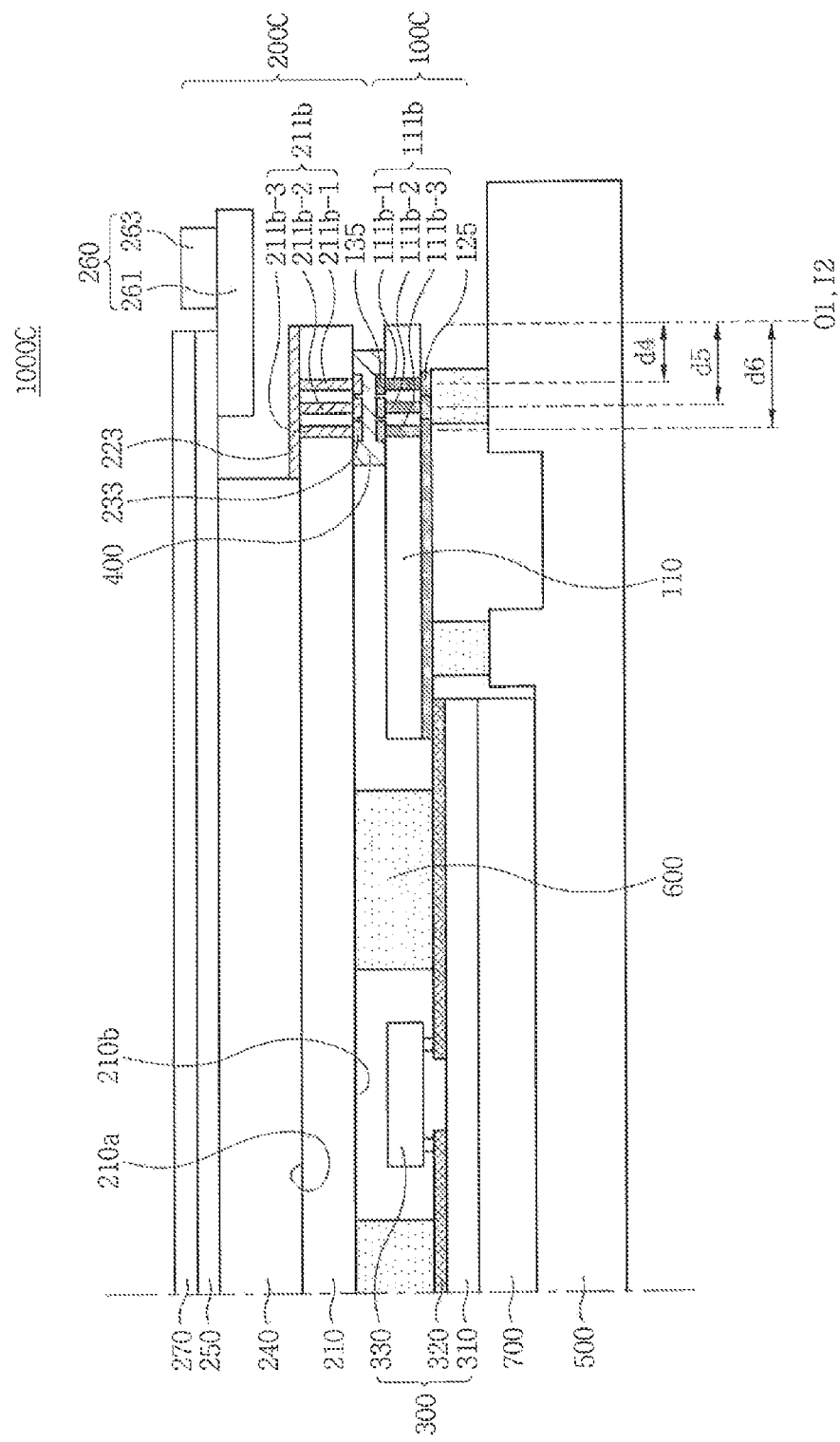

FIGS. 6A and 6B are schematic cross-sectional views of one end of a device assembly 1000C in accordance with an exemplary embodiment of the present inventive concept.

Referring to FIGS. 6A and 6B, the device assembly 1000C in accordance with an exemplary embodiment of the present inventive concept may include a COF package disposed on a lower frame 500. The device assembly 1000C may include a panel unit 200C and a control unit 300 that are electrically connected to two ends of the COF package, respectively. The device assembly 1000C may be a display device assembly. The COF package may be the same as the COF package 100C described above with reference to FIGS. 3A to 3C.

The device assembly 1000C in accordance with an exemplary embodiment of the present inventive concept is the same as the device assembly 1000E in accordance with the exemplary embodiment of the present inventive concept of FIGS. 5A-5B, except for the arrangement of bypass film-through wires 111b of the COF package 100C and bypass panel-through wires 211b of the panel unit 200C. Elements of the device assembly 1000C that are the same as those of the device assembly 1000B will not be described again here.

In the device assembly 1000C in accordance with an exemplary embodiment of the present inventive concept, the bypass film-through wires 111b of the COF package 100C may include a first bypass film-through wire 111b-1 spaced by a fourth distance d4 from an output end O1 of a film substrate 110, a second bypass film-through wire 111b-2 spaced by a fifth distance d5 from the output end O1 of the film substrate 110, and a third output film-through wire 111b-3 spaced by a sixth distance d6 from the output end O1 of the film substrate 110. The fourth distance d4, the fifth distance d5, and the sixth distance d6 may be longer than the first distance d1 (e.g., d4>d1, d5>d1, and d6>d1). The fifth distance d5 may be longer than the fourth distance d4, and shorter than the sixth distance d6 (e.g., d4<d5<d6).

In the device assembly 1000C in accordance with an exemplary embodiment of the present inventive concept, the distances between the bypass panel-through wires 211h of the panel unit 200C and an input end I2 of the panel substrate 210 may be different. For example, the bypass panel-through wires 211h may include a first bypass panel-through wire 211b-1 spaced by a fourth distance d4 from the input end I2 of the panel substrate 210, a second bypass panel-through wire 211b-2 spaced by a fifth distance d5 from the input end I2 of the panel substrate 210, and a third bypass panel-through wire 211b-3 spaced by a sixth distance d6 from the input end I2 of the panel substrate 210. The fourth distance d4, the fifth distance d5, and the sixth distance d6 may be longer than the first distance d1 (e.g., d4>d1, d5>d1, and d6>d1). The fifth distance d5 may be longer than the fourth distance d4, and shorter than the sixth distance d6 (e.g., d4<d5<d6).

As described above, in the device assemblies 1000A, 1000B, and 1000C in accordance with exemplary embodiments of the present inventive concept, 2-layer structures of the first and second film wires of the COF packages 100A, 100B, and 100C and vertical structures formed via the through wires 111 and 211 formed on the film substrate 110 and the panel substrate 210, may be electrically connected. Accordingly, in the device assemblies 1000A, 1000B, and 1000C, the COF packages 100A, 100B, and 1000 do not need to be bent when the COF packages 100A, 100B, and 1000 are disposed below the panel units 200A, 200B, and 200C, thereby preventing occurrence of a spring back phenomenon that may occur when the COF packages 100A, 100B, and 1000 are bent.

In the COF packages 100A, 100B, and 100C, each having the 2-layer structure and the vertical structure, and the device assemblies 1000A, 1000B, and 1000C including the COF packages 100A, 100B, and 100C, respectively, the distances between the film-through wires 111 and the end O1 of the film substrate 110 and the distances between the panel-through wires 211 and the end I2 of the panel substrate 210 may be formed to be the same or to be different. Thus, when the number of channels of a semiconductor chip is increased to realize a high-resolution display, spaces for forming the first and second film wires 120 and 130 in the COF packages 100A, 100B, and 100C may be easily secured. Accordingly, the sizes of the device assemblies 1000A, 1000B, and 1000C may be reduced, and the degree of integration thereof may be increased.

In COF packages and device assemblies including the same in accordance with exemplary embodiments of the present inventive concept, each of the COF packages may be vertically connected to a panel unit using a 2-layer structure and a plurality of film-through wires and a plurality of panel-through wires, while not bending each of the COF packages. Accordingly, the spring back phenomenon may be prevented from occurring in the COF packages, thereby increasing the reliability of the COF packages.

In addition, in COIF packages and device assemblies including the same in accordance with exemplary embodiments of the inventive concept, when the number of channels of a semiconductor chip is increased to realize a high-resolution display, a space for the high-resolution display is more easily secured due to the vertical structure, thereby reducing the sizes of the device assemblies and increasing the integration degree thereof.

While the inventive concept has been particularly shown and described with reference to exemplary embodiments thereof, it will be understood by those of ordinary skill in the art that various changes in form and detail may be made therein without departing from the spirit and scope of the inventive concept as defined by the following claims.

What is claimed is:

1. A device assembly comprising:
    a chip-on-film (COF) package including:
        a film substrate on which a plurality of film-through wires are formed;
        a plurality of first film wires formed on a first surface of the film substrate;
        a plurality of second film wires formed on a second surface of the film substrate, wherein the plurality of second film wires correspond to the plurality of first film wires; and
        a semiconductor chip disposed on the plurality of first film wires, wherein the plurality of film-through wires vertically pass through the film substrate to electrically connect the first film wires to the second film wires;
    a panel unit including a panel substrate on which a plurality of panel-through wires are formed, wherein the panel substrate is disposed on the COF package, and one end of the panel unit is electrically connected to a first end of the COF package; and
    a control unit disposed below the panel unit, wherein one end of the control unit is electrically connected to a second end of the COF package.

2. The device assembly of claim 1, wherein the pluralities of first and second film wires comprise:
    first and second input film wires configured to receive a signal from the control unit, and transmit the signal to the semiconductor chip;
    first and second output film wires configured to output a signal processed by the semiconductor chip to the panel unit; and
    first and second bypass film wires configured to bypass the semiconductor chip and output a signal received from the control unit to the panel unit.

3. The device assembly of claim 2, wherein the plurality of film-through wires comprise:
    output film-through wires configured to electrically connect the first output film wires and the second output film wires; and
    bypass film-through wires configured to electrically connect the first bypass film wires and the second bypass film wires,
    wherein the output film-through wires are spaced by a first distance from an output end of the film substrate, and
    the bypass film-through wires are spaced by a second distance from the output end of the film substrate,
    wherein the first distance is shorter than the second distance.

4. The device assembly of claim 3, wherein the output film-through wires comprise:
    a first output film-through wire spaced by the first distance from the output end of the film substrate; and
    a second output film-through wire spaced by a third distance from the output end of the film substrate,
    wherein the third distance is longer than the first distance.

5. The device assembly of claim 3, wherein the bypass film-through wires comprise:
    a first bypass film-through wire spaced by a fourth distance from the output end of the film substrate;
    a second bypass film-through wire spaced by a fifth distance from the output end of the film substrate; and
    a third bypass film-through wire spaced by a sixth distance from the output end of the film substrate,
    wherein the fourth, fifth, and sixth distances are longer than the first distance, and
    the fifth distance is longer than the fourth distance, and shorter than the sixth distance.

6. The device assembly of claim 1, wherein the panel unit comprises:
    a display panel disposed on a first surface of the panel substrate, the display panel configured to display an image;
    a plurality of first panel wires formed on the first surface of the panel substrate, wherein the plurality of first panel wires correspond to the pluralities of first and second film wires; and
    a plurality of second panel wires formed on a second surface of the panel substrate, wherein the plurality of second panel wires correspond to the plurality of first panel wires,
    wherein the plurality of panel-through wires vertically pass through the panel substrate to electrically connect the first panel wires to the second panel wires.

7. The device assembly of claim 6, wherein the display panel is an organic light-emitting panel (OLED) or a liquid crystal panel (LCD).

8. The device assembly of claim 7, wherein the pluralities of first and second panel wires comprise:
    first and second input panel wires configured to receive a signal supplied from the semiconductor chip; and
    first and second bypass panel wires configured to directly receive a signal supplied from the control unit while bypassing the COF package.

9. The device assembly of claim 8, wherein the plurality of panel-through wires comprise:
    input panel-through wires configured to electrically connect the first input panel wires and the second input panel wires; and
    bypass panel-through wires configured to electrically connect the first bypass panel wires and the second bypass panel wires.

10. The device assembly of claim 1, wherein the control unit comprises:
    a circuit board, wherein one end of the circuit board is disposed on the plurality of first film wires;
    a wire pattern formed on the circuit board to be electrically connected to the plurality of first film wires; and
    a circuit device disposed on the wire pattern.

11. The device assembly of claim 1, wherein the film substrate and the panel substrate are flexible.

12. A chip-on-film (COF) package comprising:
    a film substrate including a first surface and a second surface that face each other;
    a plurality of first film wires formed on the first surface;
    a plurality of second film wires formed on the second surface, wherein the plurality of second film wires correspond to the plurality of first film wires; and
    a semiconductor chip disposed on the plurality of first film wires or the plurality of second film wires,
    wherein a plurality of film-through wires vertically pass through the film substrate to electrically connect the plurality of first film wires and the plurality of second film wires.

13. The COF package of claim 12, wherein the pluralities of first and second film wires comprise:
    first and second input film wires configured to receive a signal from a control unit and transmit the signal to the semiconductor chip;
    first and second output film wires configured to output a signal processed by the semiconductor chip; and first and second bypass film wires configured to bypass the semiconductor chip and output a signal received from the control unit.

14. The COF package of claim 13, wherein the plurality of film-through wires comprise:
  output film-through wires configured to electrically connect the first output film wires and the second output film wires; and
  bypass film-through wires configured to electrically connect the first bypass film wires and the second bypass film wires,
  wherein the output film-through wires are spaced by a first distance from an output end of the film substrate,
  the bypass film-through wires are spaced by a second distance from the output end of the film substrate, and
  the first distance is shorter than the second distance.

15. A device assembly comprising:
  a control unit electrically connected to a chip-on-film (COF) package, the COF package comprising a first bypass film wire disposed on a first surface of a film substrate and a second bypass film wire disposed on a second surface of the film substrate, the first and second bypass film wires configured to bypass the COF package and output a signal received from the control unit to a panel unit, wherein the first bypass film wire is electrically connected to the second bypass film wire through rough wire vertically passing through the film substrate.

16. The device assembly of claim 15, wherein the panel unit comprises one or more bypass panel-through wires formed on a panel substrate.

17. The device assembly of claim 15, wherein the control unit comprises a circuit device.

18. The device assembly of claim 15, wherein the control unit comprises a wire pattern, the wire pattern electrically connecting the control unit to the COF package.

* * * * *